(12) United States Patent
Yamamoto

(10) Patent No.: US 9,412,710 B2
(45) Date of Patent: Aug. 9, 2016

(54) SEMICONDUCTOR DEVICE

(71) Applicant: SEIKO INSTRUMENTS INC., Chiba-shi, Chiba (JP)

(72) Inventor: Sukehiro Yamamoto, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/762,497

(22) PCT Filed: Jan. 9, 2014

(86) PCT No.: PCT/JP2014/050192
§ 371 (c)(1),
(2) Date: Jul. 22, 2015

(87) PCT Pub. No.: WO2014/119348
PCT Pub. Date: Aug. 7, 2014

(65) Prior Publication Data
US 2015/0357297 A1  Dec. 10, 2015

(30) Foreign Application Priority Data

Feb. 1, 2013 (JP) ................................ 2013-018754

(51) Int. Cl.
*H01L 23/00* (2006.01)
*H01L 23/522* (2006.01)

(52) U.S. Cl.
CPC ............ *H01L 24/05* (2013.01); *H01L 23/5226* (2013.01); *H01L 24/45* (2013.01); *H01L 24/48* (2013.01); *H01L 24/85* (2013.01); *H01L 2224/02166* (2013.01); *H01L 2224/04042* (2013.01); *H01L 2224/05085* (2013.01); *H01L 2224/05088* (2013.01); *H01L 2224/05093* (2013.01); *H01L 2224/05096* (2013.01); *H01L 2224/05553* (2013.01);

(Continued)

(58) Field of Classification Search
CPC ......... H01L 24/05; H01L 24/06; H01L 24/08; H01L 24/09; H01L 23/5226; H01L 2224/05088; H01L 2224/02166; H01L 2224/05085; H01L 2224/48463; H01L 24/48; H01L 2224/05093; H01L 2224/05096; H01L 2224/05553; H01L 2224/05558; H01L 2224/85181; H01L 2224/8534; H01L 2224/04042; H01L 2924/00
USPC ......................................... 257/780–782, 784
See application file for complete search history.

(56) References Cited

U.S. PATENT DOCUMENTS 5,248,903 A * 9/1993 Heim .................. G03F 7/70433
257/748
5,665,996 A * 9/1997 Williams ............ H01L 23/4824
257/341

(Continued)

OTHER PUBLICATIONS

Abstract, Publication No. 2004-221430, Publication Date Aug. 5, 2004.

(Continued)

*Primary Examiner* — Jasmine Clark
(74) *Attorney, Agent, or Firm* — Adams & Wilks

(57) ABSTRACT

In order to prevent a crack from developing in an interlayer insulating film formed under a bonding pad due to impact forces, the bonding pad is formed so that small diameter metal plugs and large diameter metal plugs are arranged between a first metal film and a second metal film as an uppermost layer. Holes are formed in the centers of the larger diameter metal plugs and recessed portions are formed in surface areas of the second metal film above the large diameter metal plugs.

20 Claims, 10 Drawing Sheets

(52) U.S. Cl.
CPC ............... *H01L 2224/05557* (2013.01); *H01L 2224/05558* (2013.01); *H01L 2224/45144* (2013.01); *H01L 2224/48463* (2013.01); *H01L 2224/85181* (2013.01); *H01L 2224/85205* (2013.01); *H01L 2924/00014* (2013.01)

(56) References Cited

U.S. PATENT DOCUMENTS

| | | | |
|---|---|---|---|
| 6,242,813 B1 * | 6/2001 | Huang | H01L 24/03 257/758 |
| 6,300,688 B1 * | 10/2001 | Wong | H01L 24/05 257/734 |
| 6,791,196 B2 * | 9/2004 | Kwon | H01L 24/03 257/784 |
| 2013/0043598 A1 * | 2/2013 | Chen | H01L 23/291 257/774 |

OTHER PUBLICATIONS

International Search Report mailed Apr. 15, 2014 issued in International Application No. PCT/2014/050192.

* cited by examiner

SEMICONDUCTOR DEVICE

TECHNICAL FIELD

The present invention relates to a semiconductor device including a bonding pad.

BACKGROUND ART

A related-art semiconductor device including a bonding pad is now described. FIGS. 13A-13B are sectional views for illustrating the related-art semiconductor device.

When a cross-section in the vicinity of a bonding pad is seen, a first metal film 132 is formed on an interlayer insulating film 131, and another interlayer insulating film 133 is formed so as to cover the first metal film 132. Metal plugs 134 are formed and arranged on the first metal film 132 by known photolithography and etching or by a CMP technology. A second metal film 135 is formed above the first metal film 132 so as to be connected to the first metal film 132 via the metal plugs 134. A protective film 136 has an opening above the second metal film 135. Further, the protective film 136 covers the second metal film 135 other than at the opening in the protective film 136.

In this case, embedded tungsten plugs are used as the metal plugs 134. All the metal plugs have the same diameter size close to a smallest diameter that can be formed in accordance with a process rule, and a surface of the second metal film 135 is flat (see, for example, Patent Literature 1).

CITATION LIST

Patent Literature

[PTL 1] JP 2004-221430 A

TECHNICAL PROBLEM

However, in the related art, when the second metal film 135 and the first metal film 132 are deformed by stress generated by an impact of a probe needle 200 or of wire bonding for forming a bonding ball 300, the stress concentrates in a downward direction of the bonding pad, and there is a risk in that a crack 137 may develop in the interlayer insulating film 133.

SUMMARY OF INVENTION

The present invention has been made in view of the above-mentioned problem, and an object of the present invention is to provide a semiconductor device that can prevent more effectively a crack from developing in an insulating film formed under a bonding pad.

Solution to Problem

In order to solve the problem described above, the present invention uses the following measures.

First, according to one embodiment of the present invention, there is provided a semiconductor device having a bonding pad, including: a first metal film formed on a first interlayer insulating film; a second interlayer insulating film formed on the first metal film; a metal plug formed so as to pierce the second interlayer insulating film; and a second metal film formed on the second interlayer insulating film so as to make electrical connection via the metal plug, in which the metal plug includes a first metal plug having a large diameter and a second metal plug having a small diameter, and a surface of the second metal film above the first metal plug has a recessed portion formed therein.

Further, in the semiconductor device, the first metal plug includes a high melting point metal film and the second metal film, the second metal plug includes only the high melting point metal film, and a surface of the second metal film directly above the second metal plug is flat.

Further, in the semiconductor device, the second metal plug is arranged outside a region of the bonding pad.

Further, in the semiconductor device, the second metal plug is arranged inside a region of the bonding pad.

Further, in the semiconductor device, the first metal plugs and the second metal plugs are alternately arranged in a region of the bonding pad.

Further, in the semiconductor device, the metal plugs are arranged in a shape of concentric circles.

Further, in the semiconductor device, the metal plugs are arranged in a shape of concentric circles, except for directions toward corner portions of the bonding pad.

Further, in the semiconductor device, the metal plugs are arranged in a shape of a spiral.

Further, in the semiconductor device, the metal plugs are arranged in a shape of a circle at a center portion of the bonding pad, and further, are arranged in a shape of a spiral outside the circle.

Further, in the semiconductor device, a plurality of the metal plugs gather to be a trapezoidal region, and four trapezoidal regions are arranged along four sides, respectively, of the bonding Pad.

Advantageous Effects of Invention

By using the measures described above, stress applied to a surface of the bonding pad is dispersed by being moved to the recessed portion formed in the second metal film, which can prevent a crack from developing in the insulating film formed under the bonding pad.

DESCRIPTION OF EMBODIMENTS

An embodiment of the present invention is described with reference to the drawings.

Figure 1A:
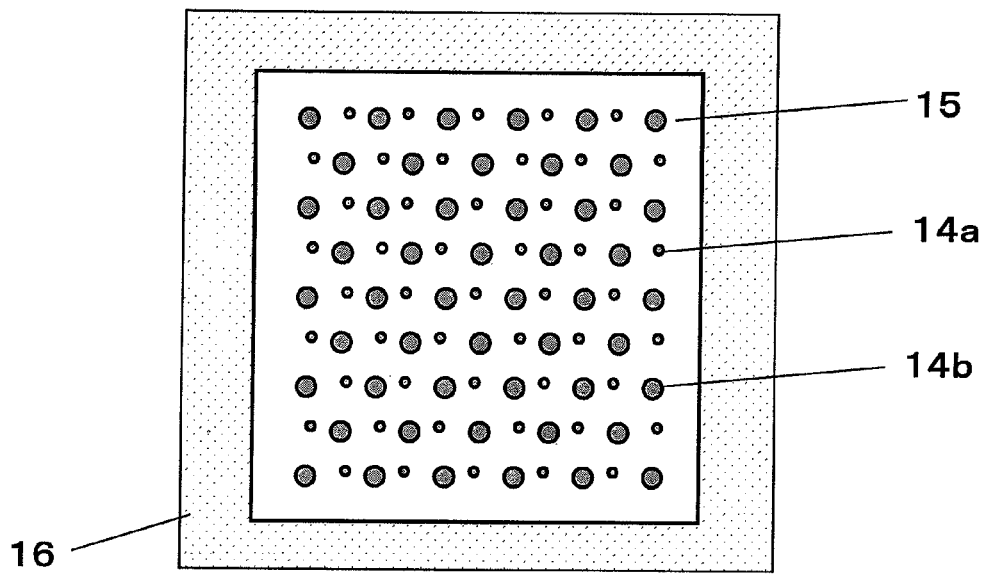
FIGS. 1A-1B are a plan view and a sectional view for illustrating a semiconductor device according to the present invention.
Figure 1B:
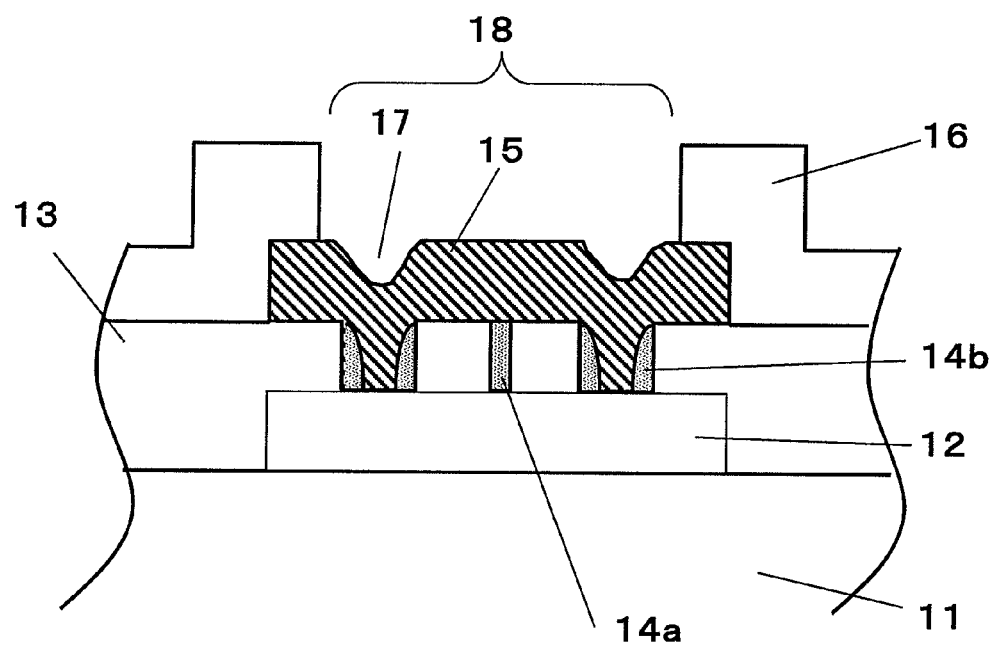

First, a basic structure of a semiconductor device including a bonding pad is described. FIGS. 1A-1B are a plan view and a sectional view for illustrating a semiconductor device according to the present invention.

FIG. 1(a) is a plan view of the bonding pad. A rectangular second metal film 15 is exposed in a region in which a protective film 16 is opened, and, in a rear surface of the second metal film 15, small diameter metal plugs 14a and large diameter metal plugs 14b having a sectional diameter larger than that of the small diameter metal plugs 14a are arranged so as to alternately occupy vertices of a lattice of uniform squares like in a checkerboard. Note that, the small diameter metal plugs 14a have a diameter size close to a smallest diameter that can be formed in accordance with a process rule. Note that, outside a bonding pad region, only the small diameter metal plugs 14a electrically connect metal wiring in the same layer as that of the second metal film 15 and metal wiring in a lower layer.

FIG. 1(b) is a sectional view of the bonding pad. A rectangular first metal film 12 is formed on a first interlayer insulating film 11 formed on a semiconductor substrate. A second interlayer insulating film 13 is formed so as to cover the first metal film 12, and via holes that reach the first metal film 12 are formed in the second interlayer insulating film 13 formed on the first metal film 12. The via holes include two kinds of large diameter via holes and small diameter via holes arranged in a mixed manner. The small diameter metal plugs 14a are formed in the small diameter via holes, respectively, by filling a barrier metal film and a tungsten film that are formed of a high melting point metal, and the large diameter metal plugs 14b are formed in the large diameter via holes, respectively, by filling the barrier metal film, the tungsten film, and the second metal film 15. The second metal film 15 is formed above the first metal film 12 via the second interlayer insulating film 13. The first metal film 12 and the second metal film 15 are electrically connected to each other via the large diameter metal plugs 14a and the small diameter metal plugs 14b.

As is clear from FIG. 1(b), a lower surface of the second metal film 15 is not flat, and film formation is carried out so that the second metal film 15 enters depressions at centers of the large diameter via holes, respectively, and thus, a front surface of the second metal film 15 is not flat either, and is shaped so as to have recessed portions 17 above the large diameter via holes, that is, above the large diameter metal plugs 14b, respectively. The protective film 16 is formed so as to cover end surfaces and side surfaces of the second metal film 15, and the protective film 16 is removed except for the end surfaces of the second metal film 15 so as to have an opening region 18.

Now, a manufacturing method after the formation of the first metal film is described. After the large diameter via holes and the small diameter via holes are formed in the second interlayer insulating film 13 using a photolithography technology and an etching technology, the barrier metal film that is titanium-based is formed by a PVD method, and then, the tungsten film is formed by a CVD method. At this time, the tungsten film is formed at such a thickness so as to completely fill the small diameter via holes and partly fill the large diameter via holes. By forming the small diameter via holes to have a diameter that is smaller than twice a sum of a thickness of the barrier metal film and a thickness of the tungsten film and forming the large diameter via holes to have a diameter that is larger than twice the sum of the thickness of the barrier metal film and the thickness of the tungsten film, the film formation of complete filling and partial filling as described above can be carried out.

Then, the tungsten film formed on the second interlayer insulating film 13 is removed by an etching back method or a CMP method. After the unnecessary tungsten film is removed by the etching back method or the CMP method, in any one of the methods, the small diameter via holes are completely filled with the barrier metal film and the tungsten film, the large diameter via holes are partly filled therewith, and holes exist at the centers of the large diameter via holes. As shown in FIG. 1(b), the large diameter metal plugs 14b have through-holes at the centers thereof surrounded by the barrier metal film and the tungsten film. In this state, when the second metal film 15 is formed by the PVD method, the second metal film 15 enters the large diameter via holes to form the recessed portions in the surface thereof. Then, the protective film 16 formed of silicon nitride or the like is formed on the surface of the second metal film 15 and on a surface of the second interlayer insulating film 13, and part of the second metal film 15 is opened, to thereby form the bonding pad (opening region) 18.

Further, FIG. 1(b) is an illustration of a shape formed by using the etching back method. Side walls of tungsten are formed on inner walls of the large diameter via holes, respectively, and the second metal film 15 fills the inside of the side walls. Bottom surfaces of the second metal film 15 are configured to be in direct contact with an upper surface of the first metal film 12. In the case of the CMP method, the tungsten film in the large diameter via holes is not removed, and thus, the second metal film 15 and the first metal film 12 are configured to be electrically connected to each other via the tungsten film and the barrier metal film. Such a bonding pad structure prevents a semiconductor element directly below the bonding pad from being damaged.

Next, dispersion of stress, which occurs when a probe test or wire bonding is carried out on the semiconductor device according to the present invention, is described.

Figure 2A:
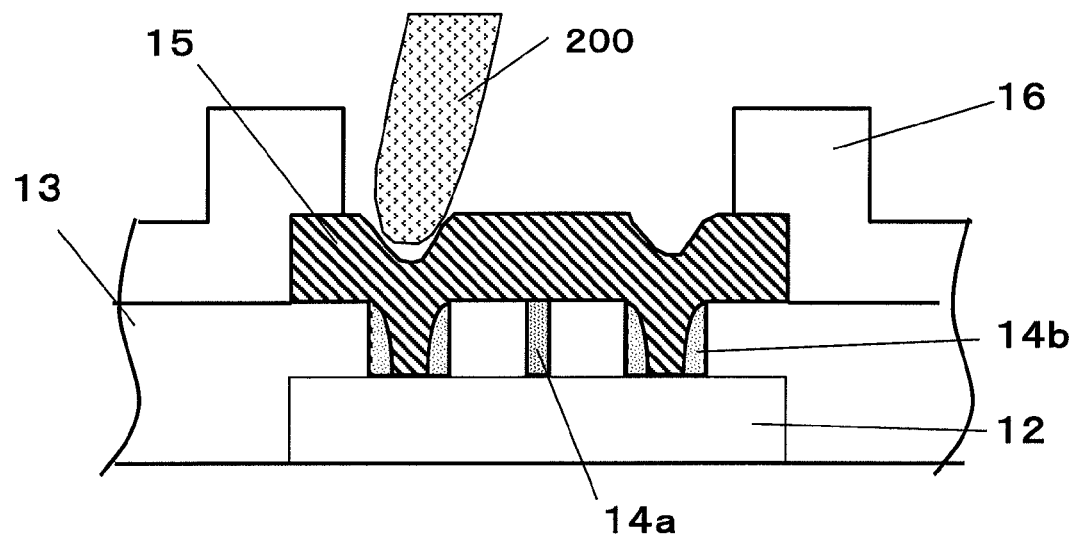
FIGS. 2A-2B are sectional views in a probe test process and a wire bonding process, respectively, of the semiconductor device according to the present invention.

FIG. 2(a) is an illustration of a state in which the probe needle 200 is in contact with the second metal film 15 in the semiconductor device according to the present invention. The probe needle 200 is slid along the surface of the second metal film 15 with a certain amount of pressure in order to enhance its electrical contact with the bonding pad. In the semiconductor device according to the present invention, the surface has the recessed portions formed therein, and a tip of the probe needle 200 is fitted into one of the recessed portions and stops. Stress applied in the region propagates through the large diameter metal plug 14b directly therebelow to be dispersed into the first metal film 12. Therefore, excessive stress can be prevented from being applied to the second interlayer insulating film 13, and a crack can be prevented from developing therein.

Figure 2B:
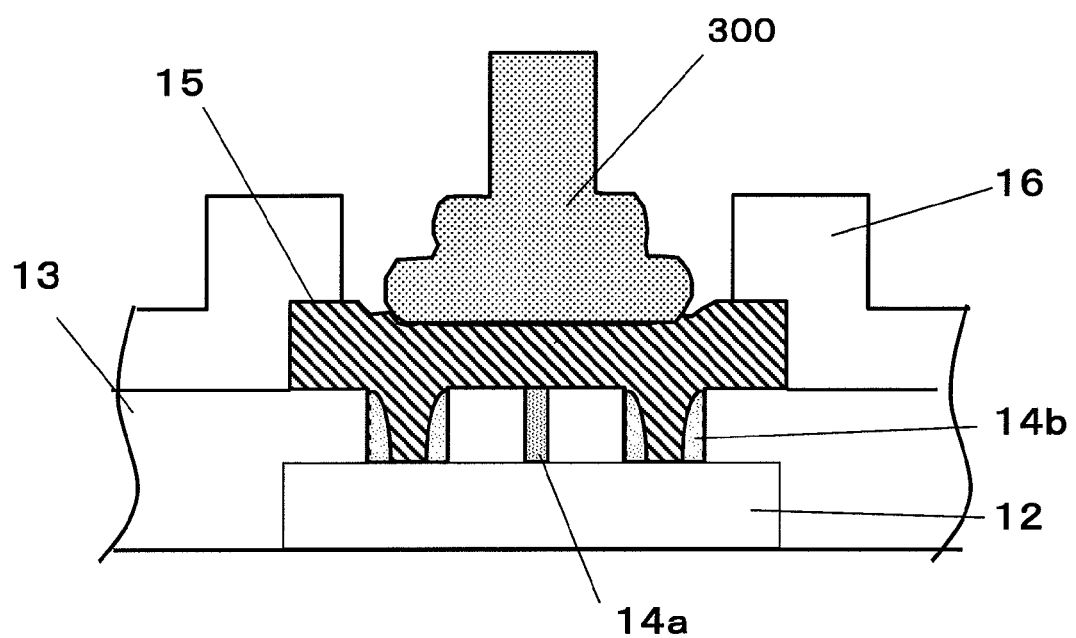

FIG. 2(b) is an illustration of a state in which a bonding ball 300 is bonded to the semiconductor device according to the present invention. In a wire bonding process, when a gold ball formed at a tip of a gold wire 300 is pressed against the second metal film 15, the metal film of a protruding portion moves to recessed portions to relax the stress. Specifically, force applied substantially perpendicularly to the surface of the second metal film 15 and an impact of ultrasonic vibrations are horizontally dispersed, and further, are dispersed into the first metal film 12 via the large diameter metal plug 14b to lessen an impact on the second interlayer insulating film 13, to thereby prevent a crack.

FIG. 3 to FIG. 12 are illustrations of various modified examples.

Modified Example 1

Figure 3A:
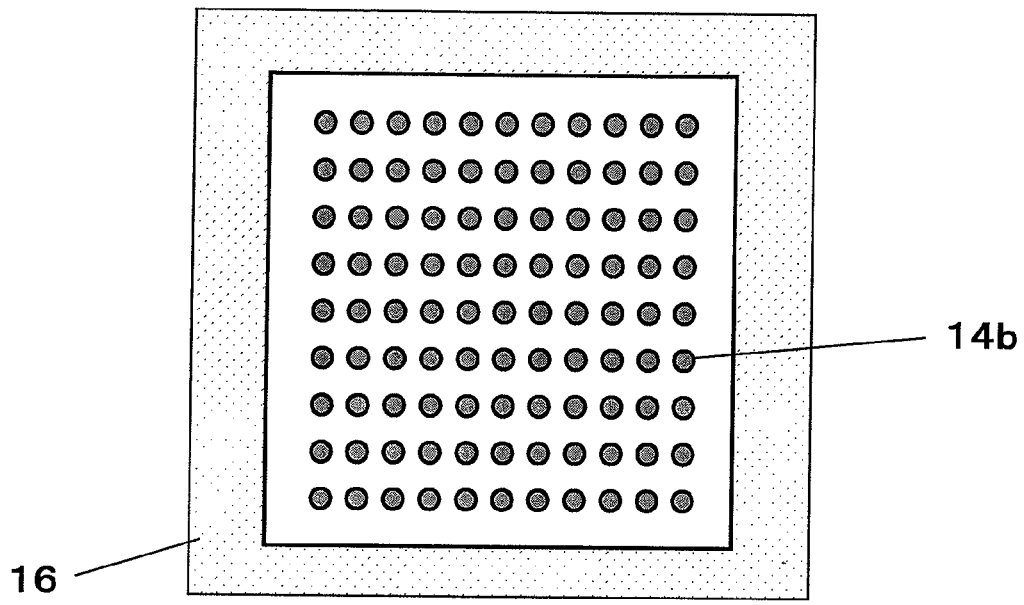
FIGS. 3A-3B are plan views for illustrating a semiconductor device according to the present invention.
Figure 3B:
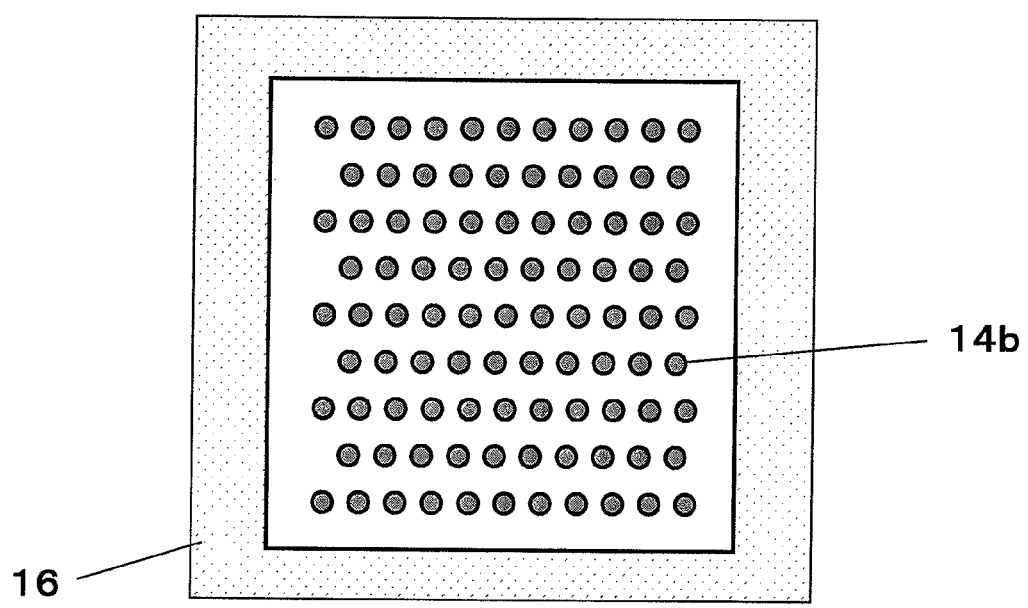

FIG. 3(a) is a plan view of a semiconductor device in which only the large diameter metal plugs 14b are arranged in the bonding pad. In FIG. 1(a), the small diameter metal plugs 14a and the large diameter metal plugs 14b having a sectional diameter larger than that of the small diameter metal plugs 14a are arranged so as to alternately occupy vertices of a lattice of uniform squares. However, in this modified example, all the vertices are occupied by the large diameter metal plugs 14b. Such a structure increases the number of the recessed portions in the bonding pad region, and increases force to relax the stress, to thereby further reduce impact on a portion under the bonding pad. FIG. 3(b) is also a plan view of a semiconductor device in which only the large diameter metal plugs 14b are arranged, but the semiconductor device is different from that illustrated in FIG. 3(a) in that the large diameter metal plugs 14b in odd-numbered rows and the large diameter metal plugs 14b in even-numbered rows are arranged so as to be offset from each other. In other words, the large diameter metal plugs 14b are arranged so as to be staggered. In this way, only the large diameter metal plugs 14b are arranged in the bonding pad region, but, outside the bonding pad region, only the small diameter metal plugs 14a electrically connect metal wiring in the same layer as that of the second metal film 15 and metal wiring in a lower layer.

Modified Example 2

Figure 4:
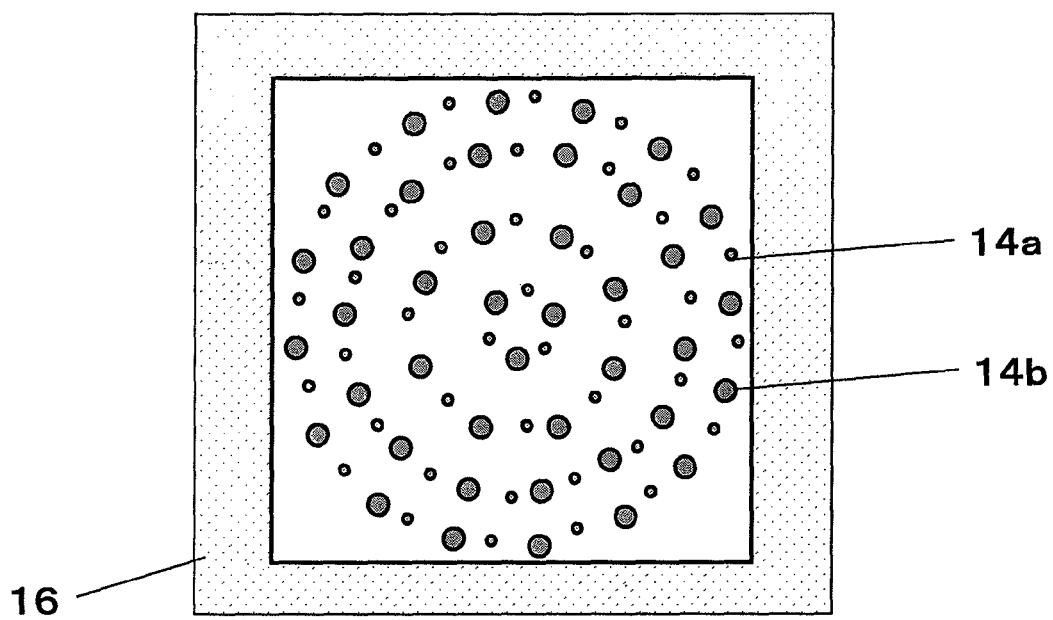
FIG. 4 is a plan view for illustrating a semiconductor device according to the present invention.
Figure 5:
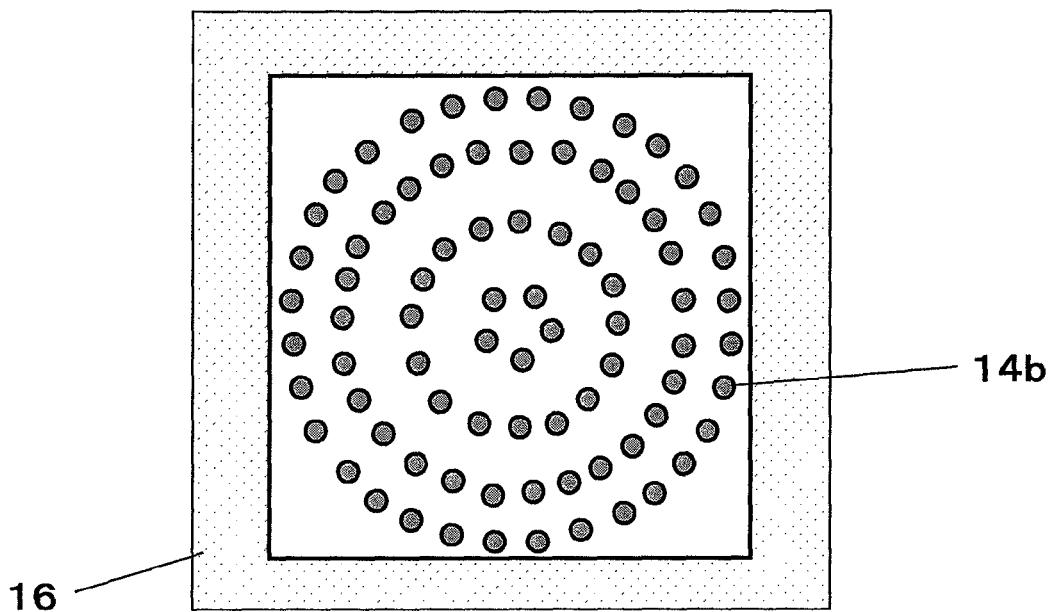
FIG. 5 is a plan view for illustrating a semiconductor device according to the present invention.

As illustrated in FIG. 4, the large diameter metal plugs 14b and the small diameter metal plugs 14a may be alternately arranged in the shape of concentric circles. Further, as illustrated in FIG. 5, only the large diameter metal plugs 14b may be arranged. The example illustrated in FIG. 5 has a larger number of the large diameter metal plugs 14b than the example illustrated in FIG. 4, and thus, the stress is more easily relaxed.

Modified Example 3

Figure 6:
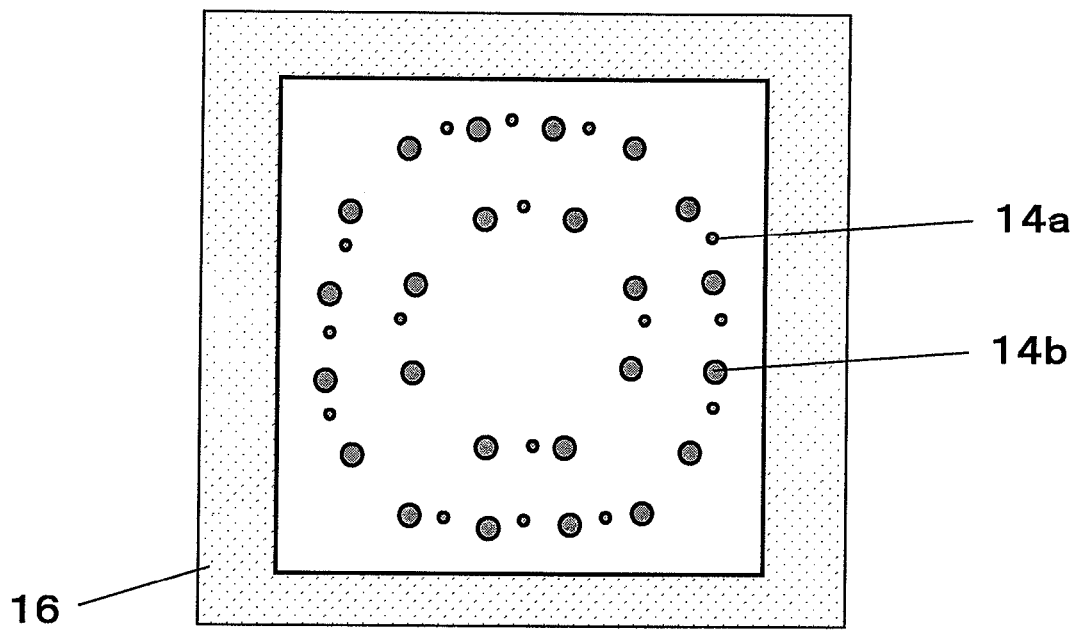
FIG. 6 is a plan view for illustrating a semiconductor device according to the present invention.
Figure 7:
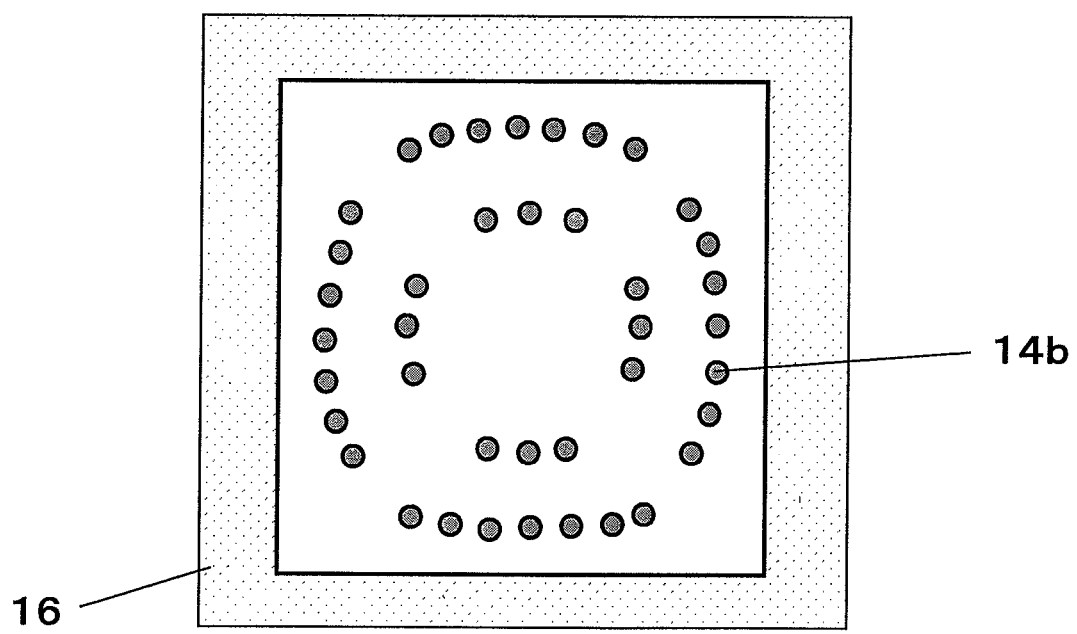
FIG. 7 is a plan view for illustrating a semiconductor device according to the present invention.

In the case illustrated in FIG. 4, the metal plugs are concentrically arranged. As illustrated in FIG. 6, the metal plugs may be arranged in the shape of circles each divided into four, except for corner portions of the bonding pad. FIG. 6 is an illustration of a case in which the large diameter metal plugs 14b and the small diameter metal plugs 14a are arranged in a mixed manner, and FIG. 7 is an illustration of a case in which only the large diameter metal plugs 14b are arranged.

Modified Example 4

Figure 8:
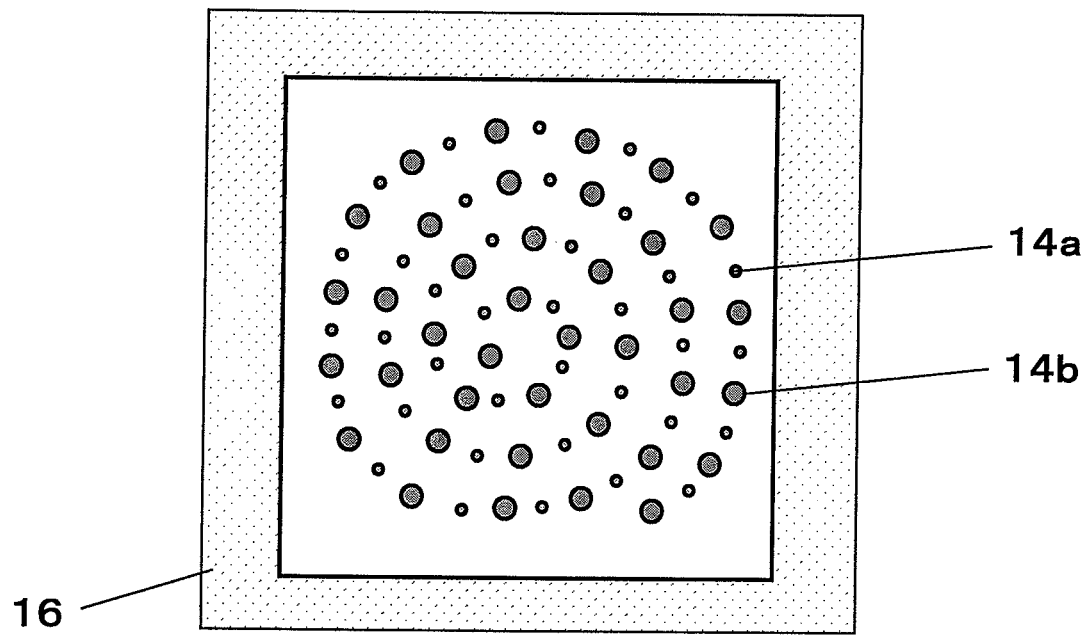
FIG. 8 is a plan view for illustrating a semiconductor device according to the present invention.
Figure 9:
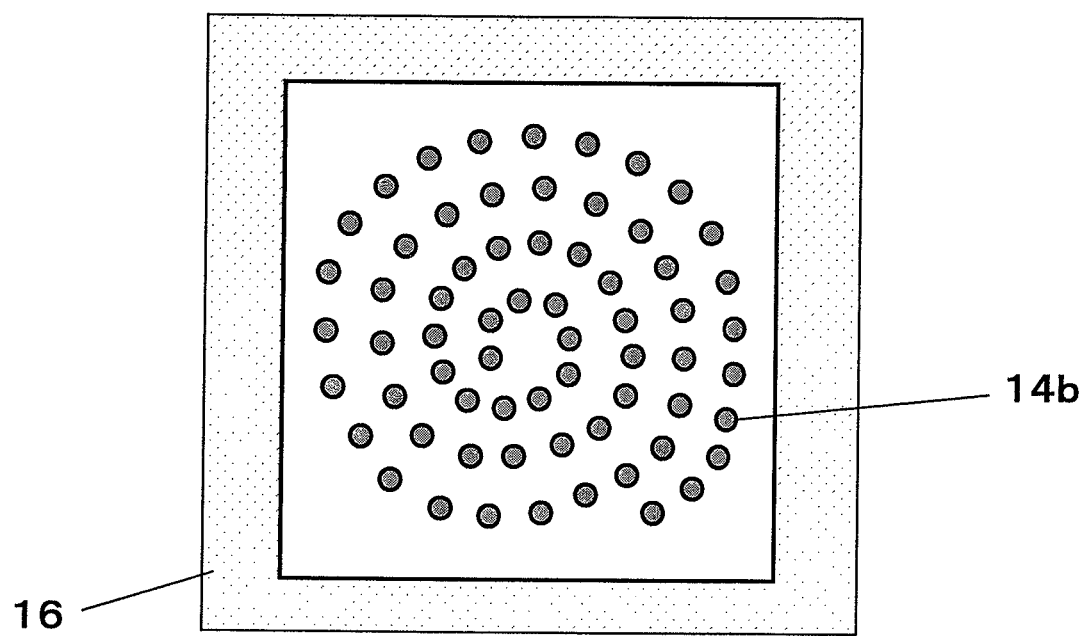
FIG. 9 is a plan view for illustrating a semiconductor device according to the present invention.

In the case illustrated in FIG. 4, the metal plugs are concentrically arranged. As illustrated in FIG. 8, the metal plugs may be arranged in the shape of a spiral as the arrangement layout. FIG. 8 is an illustration of a case in which the large diameter metal plugs 14b and the small diameter metal plugs 14a are arranged in a mixed manner, and FIG. 9 is an illustration of a case in which only the large diameter metal plugs 14b are arranged. Note that, the direction of the spiral may be clockwise or counterclockwise.

Modified Example 5

Figure 10:
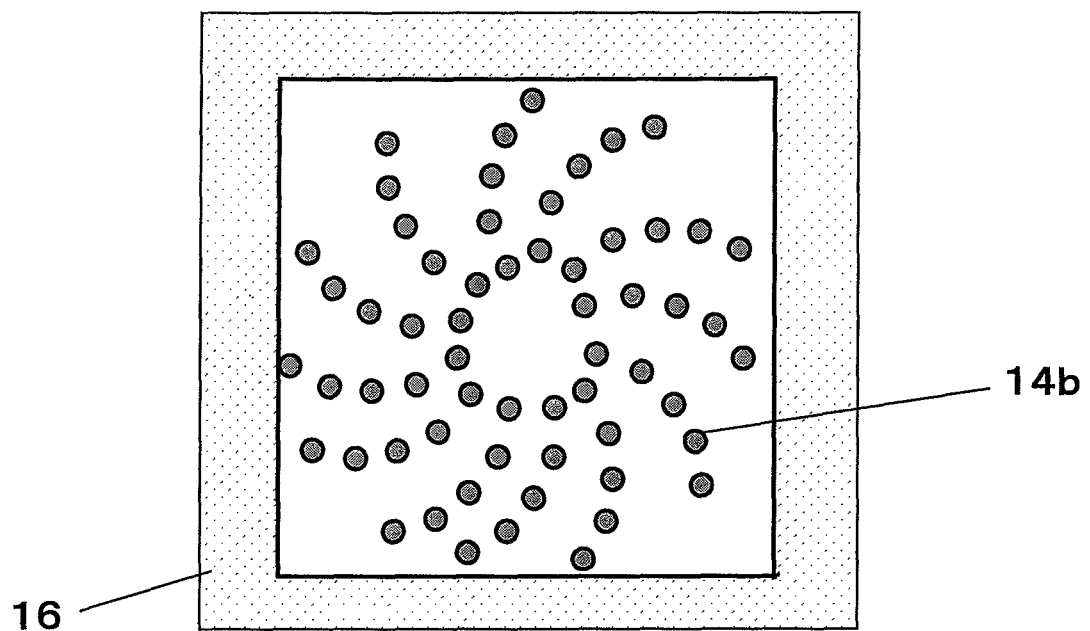
FIG. 10 is a plan view for illustrating a semiconductor device according to the present invention.

As illustrated in FIG. 10, the large diameter metal plugs 14b may be arranged in the shape of a circle at a center portion of the bonding pad, and further, may be arranged in the shape of a whirlpool outside the circle. Also in this case, the direction of the whirlpool may be clockwise or counterclockwise.

Modified Example 6

Figure 11:
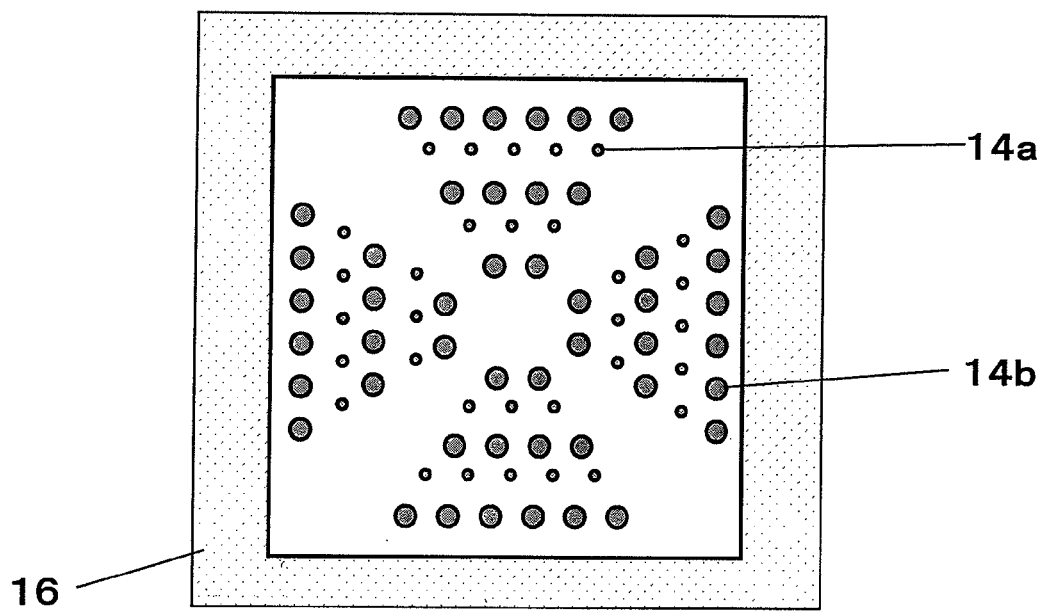
FIG. 11 is a plan view for illustrating a semiconductor device according to the present invention.
Figure 12:
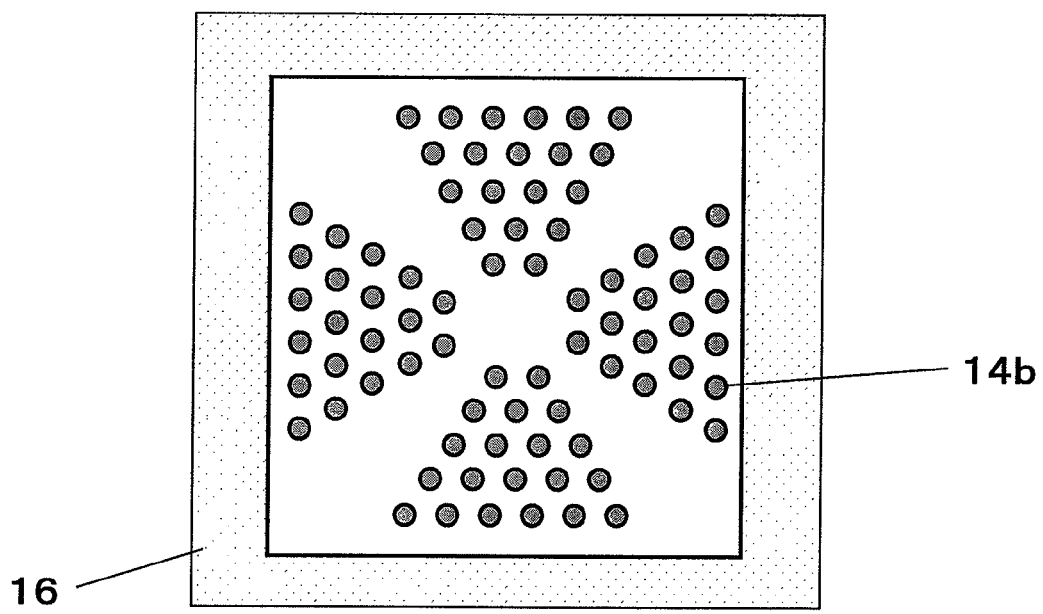
FIG. 12 is a plan view for illustrating a semiconductor device according to the present invention.
Figure 13A:
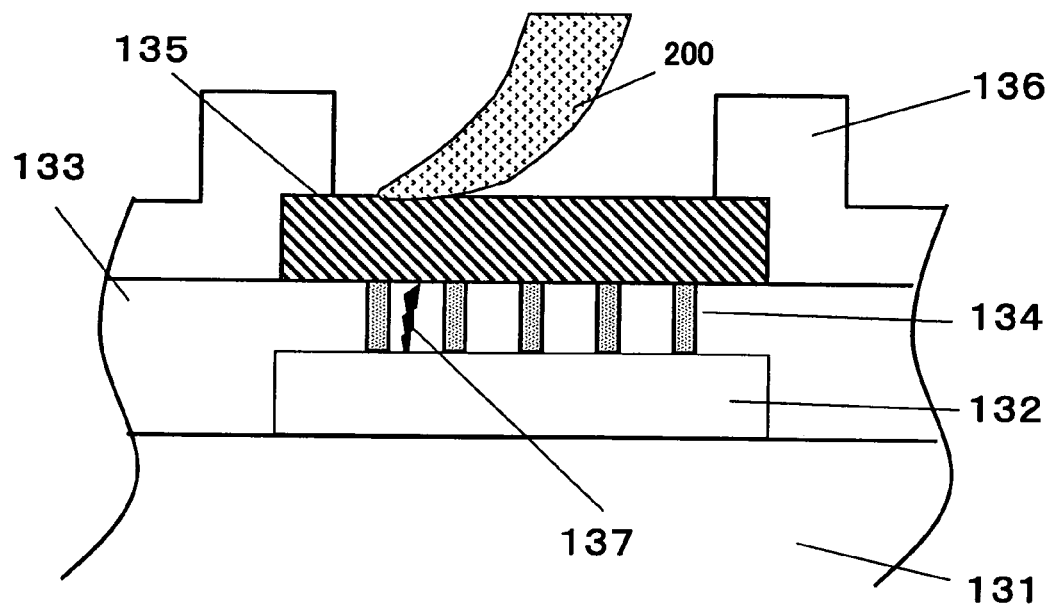
FIGS. 13A-13B are sectional views in a probe test process and a wire bonding process, respectively, of a related-art semiconductor device.
Figure 13B:
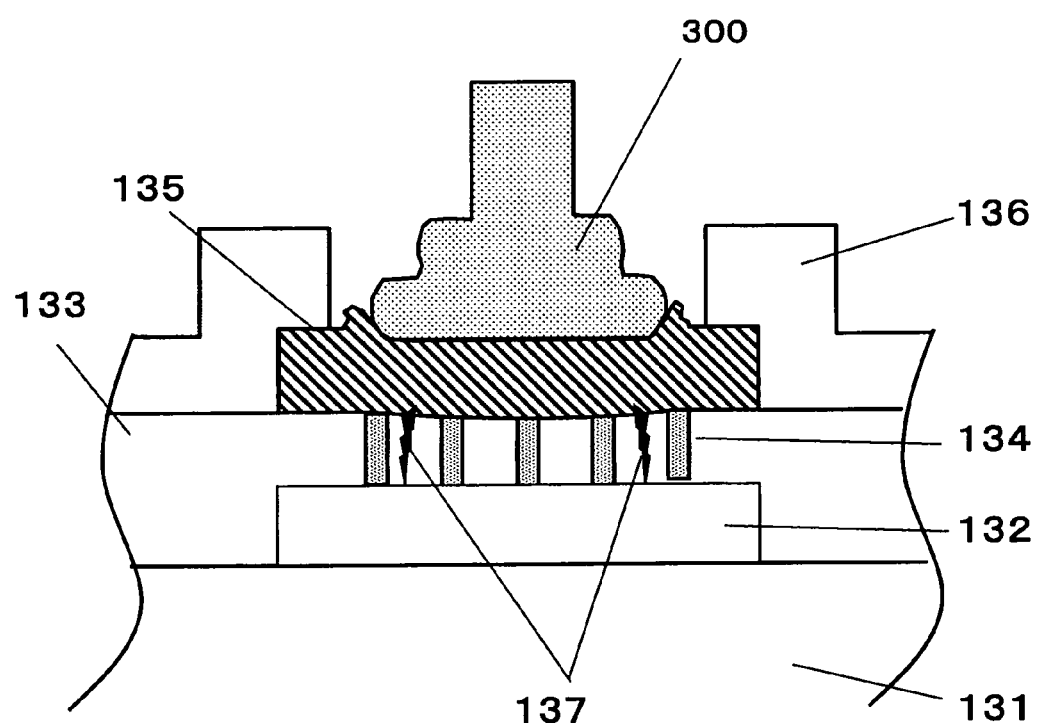

In FIG. 11 and FIG. 12, a plurality of metal plugs gather to be a trapezoidal region, and four such trapezoidal regions are arranged along four sides, respectively, of the bonding pad. In FIG. 11, the small diameter metal plugs 14a are alternately arranged, and, in FIG. 12, only the large diameter metal plugs 14b are arranged. With such a structure, stress of deformation and movement of the second metal film due to an impact in a direction in which ultrasonic vibrations of the bonding are caused is more easily relaxed by the influence of the recessed portions, and stress due to an impact in a direction of entrance of the probe is more easily relaxed.

REFERENCE SIGNS LIST 11 first interlayer insulating film
13 second interlayer insulating film
12 first metal film
14a large diameter metal plug
14b small diameter metal plug
15 second metal film
16 protective film
17 recessed portion
18 bonding pad (opening region)
131 first interlayer insulating film
133 second interlayer insulating film
132 first metal film
134 small diameter metal plug
135 second metal film
136 protective film
137 crack
200 probe needle
300 bonding ball

The invention claimed is:

1. A semiconductor device having a bonding pad, comprising:
    a first metal film formed on a first interlayer insulating film;
    a second interlayer insulating film formed on the first metal film;
    a plurality of first metal plugs and a plurality of second metal plugs formed so as to pierce the second interlayer insulating film; and
    a bonding pad formed on the second interlayer insulating film so as to make electrical connection with the first metal film via the first and second metal plugs, the bonding pad being formed of a second metal film,
    wherein the first metal plugs have a diameter larger than the diameter of the second metal plugs, and
    wherein the second metal film extends into holes in the first metal plugs so that a surface area of the bonding pad directly above each of the first metal plugs has a recessed portion formed therein.

2. A semiconductor device according to claim 1,
    wherein the first metal plugs comprise a high melting point metal film and the second metal film,
    wherein the second metal plugs comprise only the high melting point metal film, and wherein a surface of the second metal film directly above the second metal film plugs is flat.

3. A semiconductor device according to claim 1, wherein the second metal plugs are arranged outside a region of the bonding pad.

4. A semiconductor device according to claim 1, wherein the first metal plugs and the second metal plugs are alternately arranged in a region of the bonding pad.

5. A semiconductor device according to claim 1, wherein the metal plugs are arranged in a shape of concentric circles in a region of the bonding pad.

6. A semiconductor device according to claim 1, wherein the metal plugs are arranged in a shape of concentric circles in a region of the bonding pad, except for directions toward corner portions of the bonding pad.

7. A semiconductor device according to claim 1, wherein the metal plugs are arranged in a shape of a spiral in a region of the bonding pad.

8. A semiconductor device according to claim 1, wherein the metal plugs are arranged in a shape of a circle at a center portion of the bonding pad, and further, are arranged in a shape of a whirlpool outside the circle.

9. A semiconductor device according to claim 1, wherein a plurality of the metal plugs form a trapezoidal region and four trapezoidal regions are arranged along four sides, respectively, of the bonding pad in a region of the bonding pad.

10. A semiconductor device according to claim 1, wherein the holes in the first metal plugs extend completely through the first metal plugs, and the second metal film extends through the holes and directly contacts the first metal film.

11. A semiconductor device according to claim 1, wherein the first metal plugs and the second metal plugs are alternately arranged in a checkerboard pattern in a region of the bonding pad.

12. A semiconductor device having a bonding pad, comprising:
   a first metal film formed on a first interlayer insulating film;
   a second interlayer insulating film formed on the first metal film;
   a bonding pad comprised of a second metal film formed on the second interlayer insulating film; and
   metal plugs extending through the second interlayer insulating film and electrically connecting the first and second metal films, the metal plugs comprising first metal plugs and second metal plugs having a diameter smaller than the diameter of the first metal plugs, the first metal plugs having through-holes into which extend the second metal film so that surface areas of the second metal film directly overlying the first metal plugs have recessed portions.

13. A semiconductor device according to claim 12,
   wherein the first metal plugs comprise a high melting point metal film and the second metal film,
   wherein the second metal plugs comprise only the high melting point metal film, and
   wherein a surface of the second metal film directly above the second metal plugs is flat.

14. A semiconductor device according to claim 12, wherein the second metal plugs are arranged outside a region of the bonding pad.

15. A semiconductor device according to claim 12, wherein the first metal plugs and the second metal plugs are alternately arranged in a region of the bonding pad.

16. A semiconductor device according to claim 12, wherein the metal plugs are arranged in a shape of concentric circles in a region of the bonding pad.

17. A semiconductor device according to claim 12, wherein the metal plugs are arranged in a shape of concentric circles in a region of the bonding pad, except for directions toward corner portions of the bonding pad.

18. A semiconductor device according to claim 12, wherein the metal plugs are arranged in a shape of a spiral in a region of the bonding pad.

19. A semiconductor device according to claim 12, wherein the metal plugs are arranged in a shape of a circle at a center portion of the bonding pad, and further, are arranged in a shape of a whirlpool outside the circle.

20. A semiconductor device according to claim 12, wherein the first metal plugs and the second metal plugs are alternately arranged in a checkerboard pattern in a region of the bonding pad.

* * * * *